(12) United States Patent
Akimoto (10) Patent No.: US 6,475,279 B1
(45) Date of Patent: Nov. 5, 2002

(54) SUBSTRATE PROCESSING APPARATUS AND SUBSTRATE PROCESSING METHOD (75) Inventor: Masami Akimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/619,314

(22) Filed: Jul. 19, 2000

(30) Foreign Application Priority Data

Jul. 19, 1999 (JP) ............................................. 11-205078

(51) Int. Cl.[7] ........................ B05C 11/02; B05C 13/02; B05D 3/12; B05D 3/00; B05D 3/02
(52) U.S. Cl. .............................. 118/52; 118/66; 118/69; 427/240; 427/314; 427/374.1; 427/398.1
(58) Field of Search ................................ 118/52, 58, 59, 118/66, 69, 320, 666; 427/240, 425, 314, 374.1, 374.2, 398.1, 398.2, 398.3, 398.4, 398.5

(56) References Cited

U.S. PATENT DOCUMENTS

| | | | |
|---|---|---|---|
| 5,143,552 A | * 9/1992 | Moriyama | 118/666 |
| 5,664,254 A | 9/1997 | Ohkura et al. | |
| 5,972,110 A | * 10/1999 | Akimoto | 118/69 |
| 6,215,545 B1 | * 4/2001 | Matsuyama | 118/52 |
| 6,341,903 B1 | * 1/2002 | Ueda | 118/52 |

* cited by examiner

Primary Examiner—Richard Crispino
Assistant Examiner—Kevin Shortsle
(74) Attorney, Agent, or Firm—Rader, Fishman & Grauer PLLC (57) ABSTRACT A substrate which has been subjected to heat processing in any of hot plate units is transferred to a normal cooling unit by a transfer device and subjected to cooling processing to some extent, and then transferred to a high accuracy cooling unit and subjected to cooling processing with high accuracy, and thereafter transferred to any of coating units or a developing units. Thereby, the substrate can be subjected to the cooling processing with high accuracy and thereafter to coating processing with no increase in apparatus cost and with no decrease in throughput.

18 Claims, 11 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method each for applying a coating solution to a substrate such as a semiconductor wafer and the like and performing heat processing and subsequent cooling processing for the substrate.

2. Description of the Related Art

In a photolithography process of a semiconductor device, a semiconductor wafer is coated with a resist, a resist film formed by the coating is exposed in accordance with a predetermined circuit pattern, and the exposed pattern is developed, whereby a circuit pattern is formed on the resist film.

To perform such a series of processes, a resist coating and developing processing system has been conventionally used. The resist coating and developing processing system is so structured that a processing station in which various kinds of processing units for performing various kinds of processing for coating and developing on the semiconductor wafer are multi-tiered, a cassette station, in which cassettes for housing a plurality of semiconductor wafers are mounted, for carrying the semiconductor wafers into the processing station one by one and carrying a semiconductor wafer after processing out of the processing station and housing it in a cassette, an d a n interface section for receiving and passing the semiconductor wafer from/to an aligner, provided adjacent to the system, for exposing a resist film in a predetermined pattern, are integrally provided.

I n such a resist coating and developing processing system, for example, wafers are taken out of the cassette placed in the cassette station one by one and transferred to the processing station. After the wafer is first brought to a predetermined temperature in a cooling unit, a reflection prevention film (a bottom layer) is formed in a resist coating unit, and the wafer is subjected to heat processing in a hot plate unit (a heat processing unit) and cooled in a cooling unit (a cooling processing unit). Then, the wafer is coated with a photo resist film in a resist coating unit and subjected to baking processing in a heat processing unit.

Thereafter, the semiconductor wafer is transferred to the aligner from the processing station via the interface section, and the resist film is exposed in a predetermined pattern in the aligner. After the exposure, the semiconductor wafer is transferred again to the processing station via the interface section. First, the exposed semiconductor wafer is subjected to post-exposure bake processing in the hot plate unit, and coated with a developing solution in the developing unit after cooling, whereby the exposed pattern is developed. Thereafter, the wafer is subjected to postbake processing in the hot plate unit and cooled, thereby completing a series of processes. After the completion of the series of the processes, the semiconductor wafer is transferred to the cassette station and housed in a wafer cassette. Such processes are repeated successively for a predetermined number of semiconductor wafers one by one.

In such a series of resist coating and developing processing, as described above, heat processing is performed in the hot plate unit prior to the resist coating and the developing solution coating. However, since the resist coating and the developing solution coating are carried out in a temperature-adjusted atmosphere, the semiconductor wafer after the heat processing needs to be cooled in the cooling unit and controlled to a predetermined temperature.

By the way, in recent years, a demand for micromachining of a semiconductor device has been increased, and hence a high sensitive type resist solution is used. Accordingly, it is necessary to manage an atmosphere temperature in the resist coating with high accuracy.

Therefore, it is required to control a substrate temperature with high accuracy in the cooling unit before the substrate is carried into the resist coating unit. Further, temperature control with high accuracy is required also in the developing unit though the control is not so high in accuracy as that in the resist coating unit.

However, in the above-described resist coating and developing processing system, for the reason that semiconductor wafers are successively processed one by one at a high speed, many hot plate units and cooling units are mounted. Since the semiconductor wafers are transferred to the resist coating units from many cooling units, it is necessary to make these all cooling units temperature-controllable higher in accuracy than conventional ones in order to realize the temperature control with high accuracy in the cooling units, resulting in increased apparatus cost. On the other hand, if the number of the cooling units is reduced to avoid such an inconvenience, the cooling processing is delayed, which causes reduction in throughput.

SUMMARY OF THE INVENTION

An object of the invention is to provide a substrate processing apparatus and a substrate processing method capable of cooling a substrate with high accuracy and thereafter performing coating processing without increasing apparatus cost and decreasing throughput.

To solve the above problem, a first aspect of the present invention is a substrate processing apparatus for applying a coating solution to a substrate and performing heat processing and subsequent cooling processing for the substrate comprising: a coating processing unit for applying the coating solution to the substrate; a heat processing unit for performing the heat processing for the substrate; a plurality of first cooling processing units, which are temperature-controlled with comparatively low accuracy, for performing the cooling processing for the substrate; a second cooling processing unit, which is temperature-controlled with comparatively high accuracy, for performing the cooling processing for the substrate; and a transfer mechanism for transferring the substrate between the units, wherein the substrate which has been subjected to the heat processing by the heat processing unit is subjected to the cooling processing in the first cooling processing unit or the second cooling processing unit, and wherein when the substrate is transferred to the coating processing unit, the substrate is cooled in the second cooling processing unit at all times and then directly transferred to the coating processing unit.

Further, a second aspect of the present invention is a substrate processing method for applying a coating solution to a substrate and performing heat processing and subsequent cooling processing for the substrate, wherein cooling for the substrate after the heat processing is performed in a plurality of first cooling processing units, which are temperature-controlled with comparatively low accuracy, for performing the cooling processing for the substrate and in a second cooling processing unit, which is temperature-controlled with comparatively high accuracy, for performing the cooling processing for the substrate, and wherein when the substrate is transferred to the coating processing unit, the substrate is cooled in the second cooling processing unit at all times and then subjected to coating processing.

According to the present invention, the substrate which has been subjected to the heat processing is subjected to the cooling processing in the plurality of first cooling processing units which are temperature-controlled with comparatively low accuracy and in a second cooling processing unit which is temperature-controlled with comparatively high accuracy. When the substrate is transferred to the coating processing unit, the wafer is cooled at all times in the second cooling processing unit which is temperature-controlled with high accuracy and then transferred directly to the coating processing unit. Therefore, after rough cooling processing with low accuracy is performed in the plurality of first cooling processing units, the temperature control can be performed with high accuracy in a short period of time in the second cooling processing unit, thereby performing high accuracy cooling with no decrease in throughput. Moreover, it is sufficient to partly use such cooling processing units for performing temperature control with high accuracy, and thus an increase in apparatus cost can be suppressed.

In the aforesaid substrate processing apparatus, the substrate which has been subjected to the heat processing by the heat processing unit is subjected to the cooling processing in any of the first cooling processing units and thereafter to the cooling processing in the second cooling processing unit, whereby the substrate is temperature-adjusted in the cooling processing unit with the same high accuracy at all times and then transferred to the coating processing unit, resulting in a further increased accuracy in temperature control. Moreover, the rough cooling processing is performed in the first cooling processing unit and thereafter the cooling processing is performed in the second cooling processing unit, so that the cooling processing in the second cooling processing unit is performed sufficiently in a short period of time and many substrates can be successively cooled with high accuracy, resulting in improved throughput. More than that, a small number of high accuracy cooling processing units are sufficient, and thus there is little increase in apparatus cost.

It is preferable to further comprise control means for controlling the transfer mechanism so that when the substrate is transferred to the coating processing unit, the substrate is cooled in the second cooling processing unit at all times and then transferred directly to the coating processing unit.

Further, it is preferable that the second cooling processing unit is placed in an atmosphere of the coating processing unit. Thereby, the cooling processing in the second cooling processing unit can be performed in the same atmosphere as that of the coating processing unit, so that the accuracy of the cooling temperature can be further improved.

By way of typical examples of the coating processing units, given are a resist coating unit for applying a resist solution and a developing unit for applying a developing solution on a resist film to perform developing after the resist film on the substrate is exposed in a predetermined pattern.

The resist coating unit or the developing unit may have a control sensor for detecting a humidity of air supplied to the resist coating unit or the developing unit and a humidity control section for controlling the humidity based on a result detected by the control sensor. Thereby, it is possible to supply the air which is finely controlled in temperature and humidity to the resist coating unit and the developing unit.

The first cooing processing unit, which is temperature-controlled with low accuracy, may be cooled using a tap water. Thereby, the cooling processing unit can be fabricated at low cost.

Moreover, a cooling temperature of the first cooling processing unit which is temperature-controlled with low accuracy may be controlled at a temperature lower than a cooling temperature of the second cooling processing unit which is temperature-controlled with high accuracy, thereby reducing the period of cooling time of the substrate.

The cooling temperature of the first cooling processing unit which is temperature-controlled with low accuracy is set lower than a desired substrate adjustment temperature to be controlled, thereby further reducing the period of cooling time of the substrate. The cooling may be performed so that the high accuracy cooling temperature before the substrate is transferred to the resist coating unit is controlled with accuracy higher than that of the high accuracy cooling temperature before the substrate is transferred to the developing unit, thereby obtaining the resist coating unit and the developing unit at low cost.

These objects and still other objects and advantages of the present invention will become apparent upon reading the following specification when taken in conjunction with the accompanying drawings.

BRIEF DESCRIPTION OF THE DRAWINGS

FIG. 10 are external views in the high accuracy cooling unit of (a): the case of using a large number of Peltier elements and (b): the case of using a small number of Peltier elements according to still another modification of the high accuracy cooling unit;

FIG. 11 are sectional views in the high accuracy cooling unit of (a): the case of using a large number of Peltier elements and (b): the case of using a small number of Peltier elements according to yet another modification of the high accuracy cooling unit.

DETAILED DESCRIPTION OF THE PREFERRED EMBODIMENT

Hereinafter, an embodiment of the present invention will be described in detail with reference to the accompanying drawings.

Figure 1:
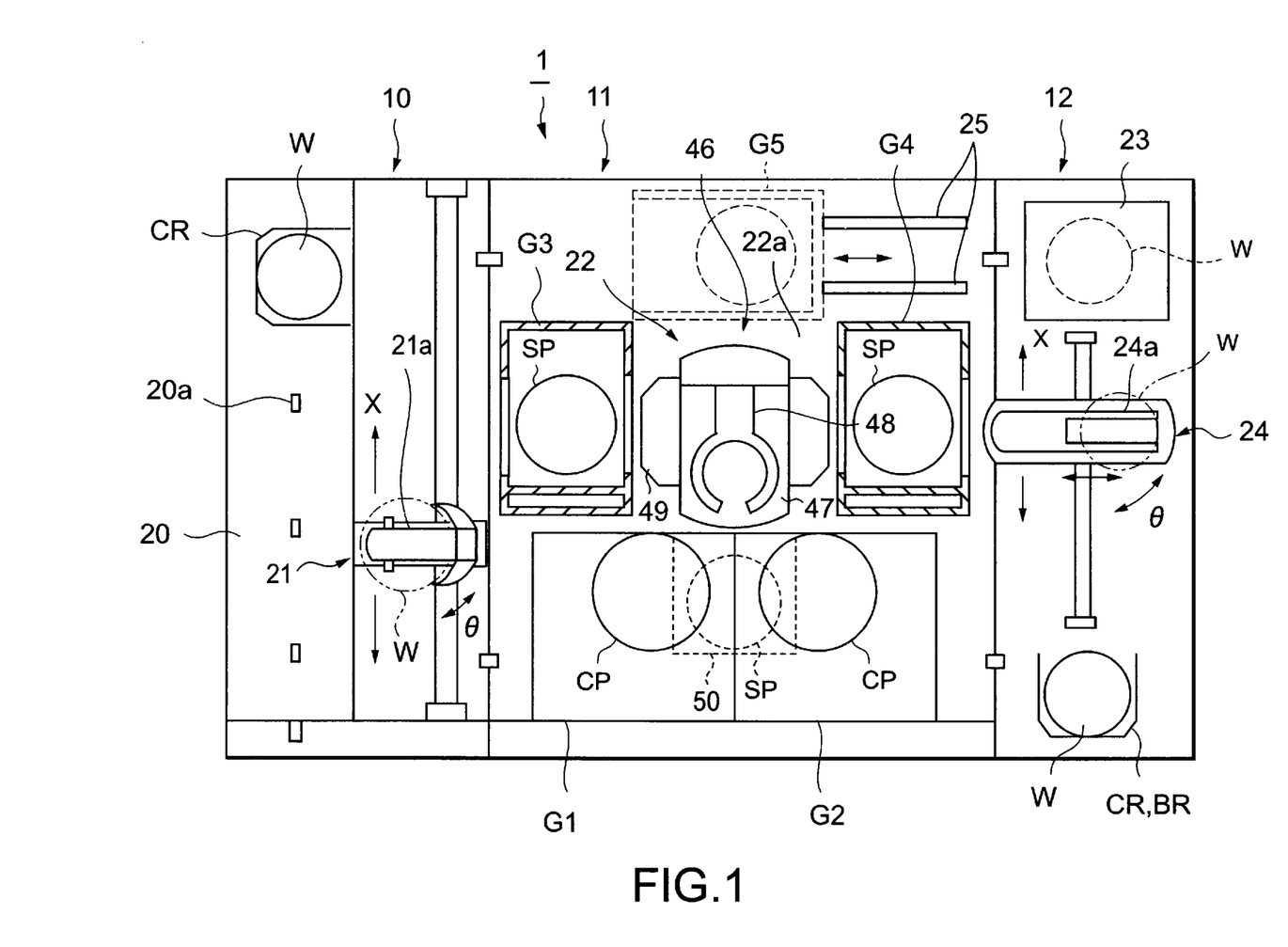
FIG. 1 is a plane view showing the entire structure of a resist coating and developing processing system for a semiconductor wafer according to an embodiment of the present invention.
Figure 2:
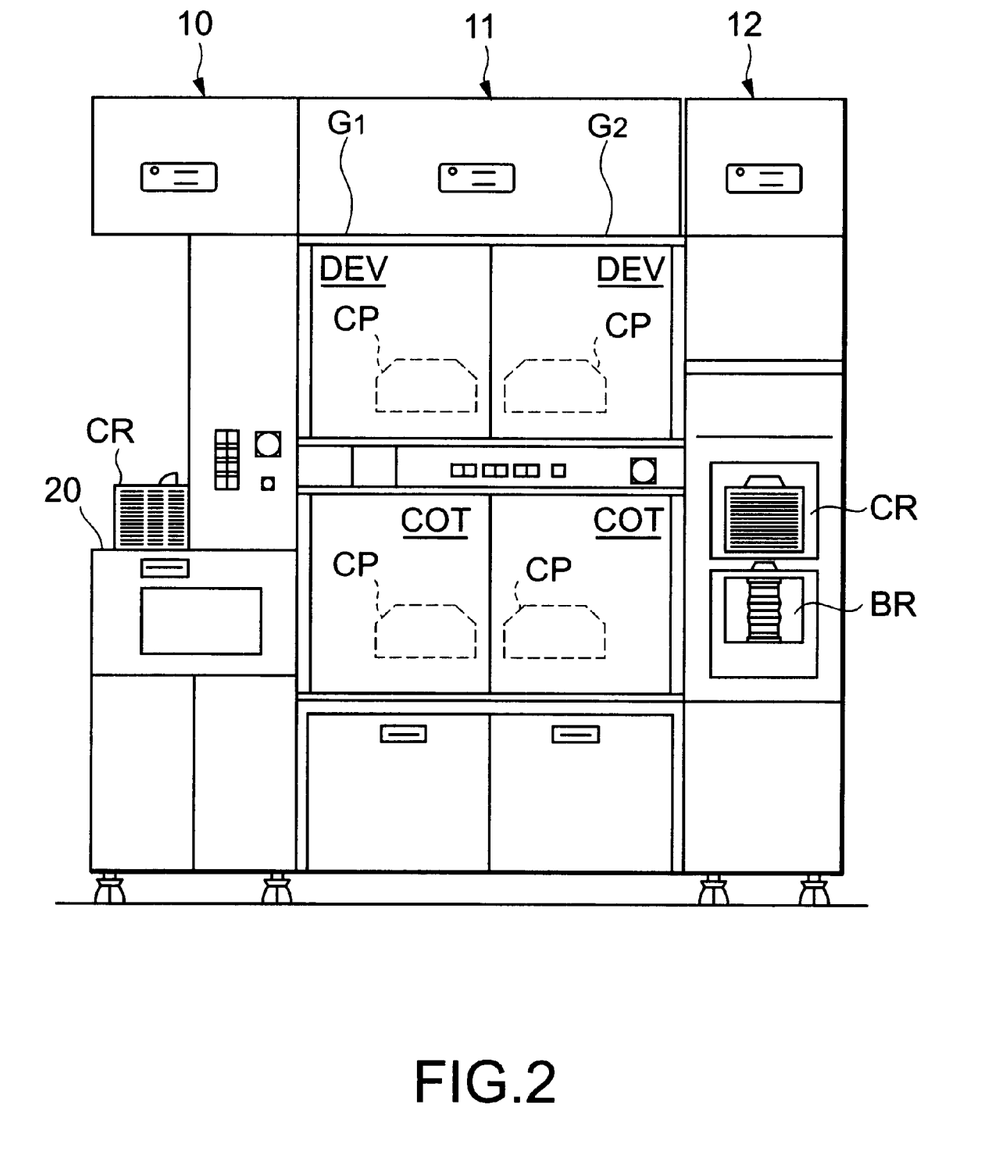
FIG. 2 is a front view showing the entire structure of the resist coating and developing processing system for a semiconductor wafer according to the embodiment of the present invention.
Figure 3:
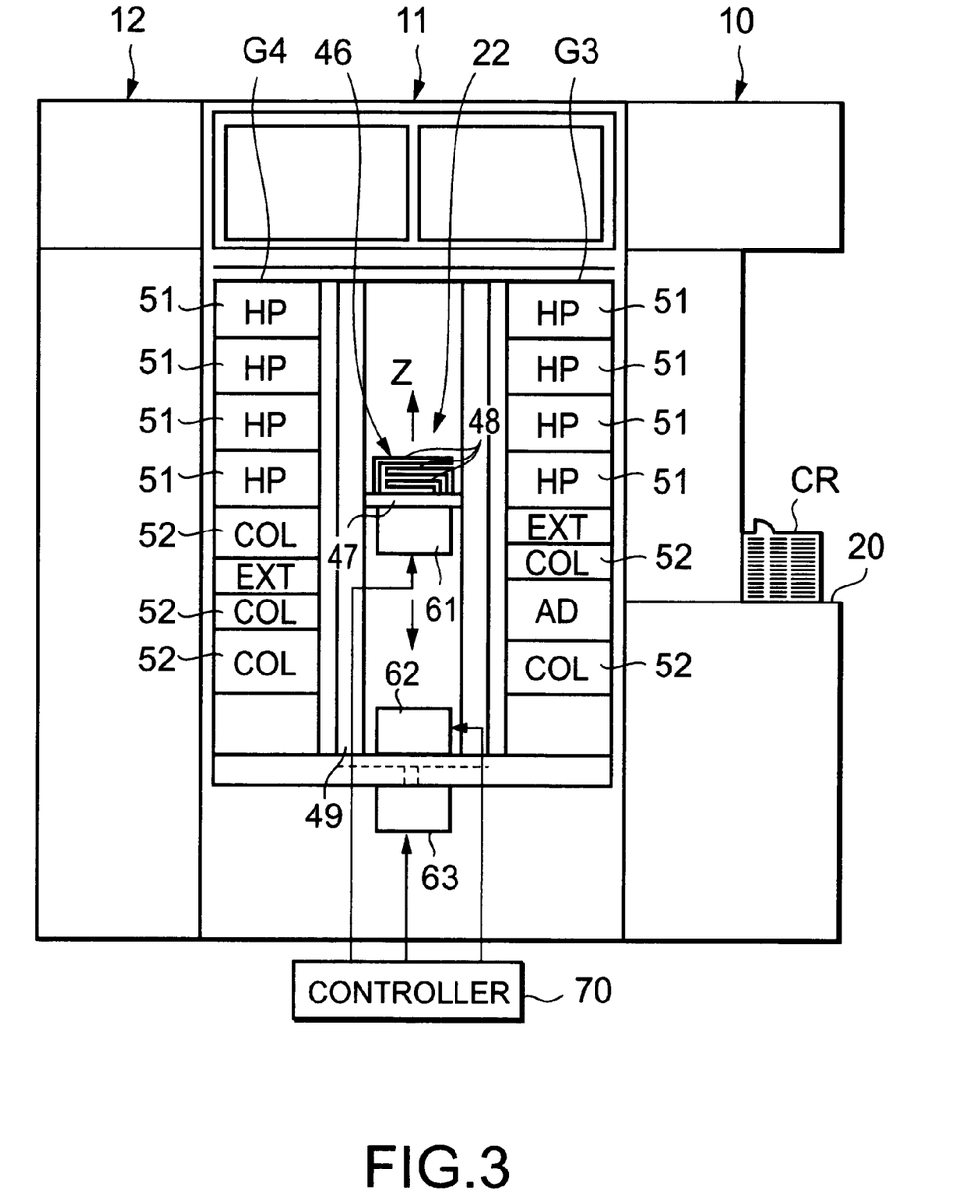
FIG. 3 is a rear view showing the entire structure of the resist coating and developing processing system for a semiconductor wafer according to the embodiment of the present invention.
Figure 4:
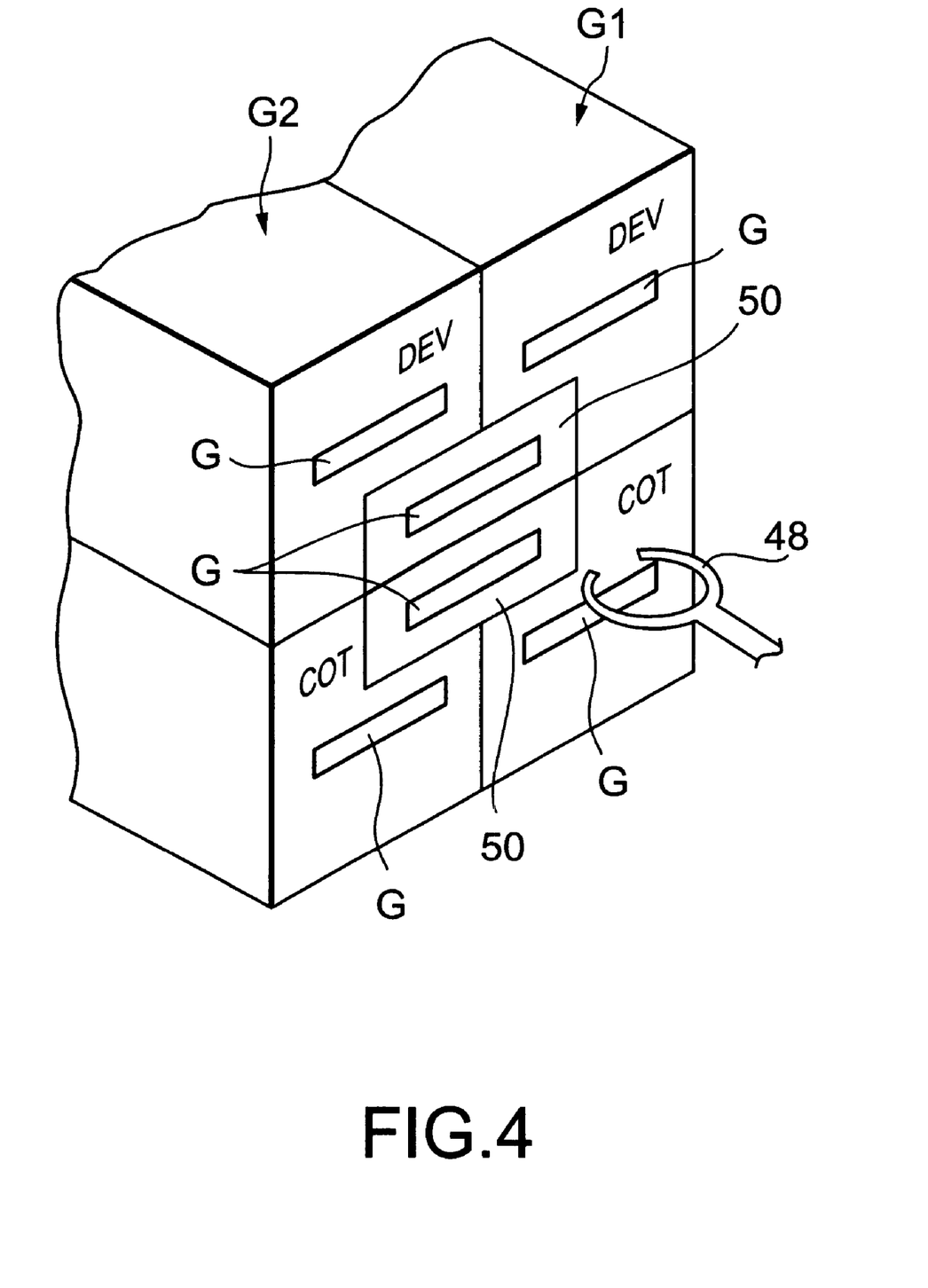
FIG. 4 is a perspective view showing part of the resist coating and developing processing system according to the embodiment of the present invention.

FIG. 1 is a schematic plane view showing a resist coating and developing processing system according to an embodiment of the present invention, FIG. 2 is a front view thereof, and FIG. 3 is a rear view thereof. FIG. 4 is a perspective view showing part of the resist coating and developing processing system.

A resist coating and developing processing system 1 comprises a cassette station 10 which is a transfer station, a processing station 11 having a plurality of processing units, and an interface section 12 for delivering a wafer W to/from an aligner (not illustrated) provided adjacent to the processing station 11.

The aforesaid cassette station 10 has functions of carrying a plurality of, for example, 25 semiconductor wafers W (hereinafter referred to as only wafers W) as objects to be processed, as a unit, housed in a wafer cassette CR from another system into this system or from this system to another system, and transferring the wafer W between the wafer cassette CR and the processing station 11.

In this cassette station 10, as shown in FIG. 1, a plurality of (four in FIG. 1) positioning projections 20a are formed on a wafer cassette mounting table 20 along an X-direction in FIG. 1 and the wafer cassettes CR can be mounted in a line with respective wafer transfer ports facing the processing station 11 side at positions of the projections 20a. In the wafer cassette CR, the wafers W are arranged in a vertical direction (a Z-direction). Moreover, the cassette station 10 includes a wafer transfer mechanism 21 positioned between the wafer cassette mounting table 20 and the processing station 11. The wafer transfer mechanism 21 includes a wafer transfer arm 21a movable in the direction of arrangement of the cassettes (the X-direction) and in the direction of arrangement of the wafers W housed in the wafer cassette (the Z-direction) and can selectively get access to any of the wafer cassettes CR by the wafer transfer arm 21a. The wafer transfer arm 21a is also structured to be rotatable in a θ-direction so as to be also accessible to an extension unit (EXT) included in a third processing unit group $G_3$ described later on the processing station 11 side.

The processing station 11 includes a plurality of processing units for carrying out a series of processes when coating and developing are performed for the wafer W. These units are multi-tiered at predetermined positions, and the wafers W are processed one by one by these units. As shown in FIG. 1, the processing station 11 has a transfer path 22a in the middle thereof in which a main wafer transfer mechanism 22 is provided, and all the processing units are arranged around the wafer transfer path 22a. The plurality of processing units are divided into a plurality of processing unit groups, and a plurality of processing units are multi-tiered along the vertical direction in each processing unit group.

As shown in FIG. 3, the main wafer transfer mechanism 22 is structured to include a wafer transfer device 46 within a cylindrical supporter 49, and the wafer transfer device 46 is configured to be ascended and descended in the vertical direction (the Z-direction) by belt drive by means of a drive mechanism 62. The cylindrical supporter 49 can rotate by rotational driving force of a drive mechanism 63, and also the wafer transfer device 46 can be integrally rotated with the cylindrical supporter 49.

The wafer transfer device 46 includes a plurality of holding members (tweezers) 48 which are movable in a forward and rearward direction of a transfer base 47. The use of the holding members 48 realizes delivery of the wafer W between the processing units. The drive of the holding members 48 at that time is performed by a drive mechanism 61.

These drive mechanisms 61, 62, and 63 are controlled by a controller 70, whereby the transfer of the wafer W is performed in accordance with a predetermined sequence.

As shown in FIG. 1, four processing unit groups $G_1$, $G_2$, $G_3$, and $G_4$ are actually arranged around the wafer transfer path 22a in this embodiment and a processing unit group $G_5$ can be disposed as required.

Out of these, the first and second processing unit groups $G_1$ and $G_2$ are arranged in a raw on the front side of the system (on the lower side in FIG. 1), the third processing unit group $G_3$ is arranged adjacent to the cassette station 10, and the fourth processing unit group $G_4$ is arranged adjacent to the interface section 12. Moreover, the fifth processing unit group $G_5$ can be arranged on the rear side.

As shown in FIG. 2, in the first processing unit group $G_1$, two spinner-type processing units in which the wafer W is mounted on a spin chuck (not illustrated) inside a cup CP to undergo predetermined processing are vertically two-tiered. In this embodiment, a resist coating unit (COT) for applying a resist onto the wafer W and a developing unit (DEV) for developing a pattern of the resist are two-tiered from the bottom in order. Similarly, in the second processing unit group $G_2$, a resist coating unit (COT) and a developing unit (DEV) as two spinner-type processing units are two-tiered from the bottom in order. Any one of the resist coating unit (COT) of the first processing unit group $G_1$ and the resist coating unit (COT) of the second processing unit group $G_2$ is used for resist coating for forming a reflection prevention film (a bottom layer) and the other is used for normal resist coating for forming a pattern. It should be noted that since the resist coating unit (COT) and the developing unit (DEV) need to be temperature-controlled accurately from a viewpoint of forming a circuit pattern with high accuracy, the first processing unit group $G_1$ and the second processing unit group $G_2$ are configured to be subjected to temperature management with accuracy higher than that of other portions.

Further, as shown in FIG. 1 to FIG. 4, in the first processing unit group $G_1$ and the second processing unit group $G_2$, two high accuracy cooling units (HCOL) 50 are vertically two-tiered at a position between both the processing unit groups $G_1$ and $G_2$ and between the respective developing units (DEV) and resist coating units (COT). The high accuracy cooling unit (HCOL) 50 performs temperature control with accuracy higher than that of the conventional cooling unit. Incidentally, in FIG. 4, a letter G shows a wafer carrying in/out port of each unit.

The reason why the resist coating unit (COT) is disposed on the lower tier side is that drainage of a resist solution is essentially more complex in terms of both mechanism and maintenance than that of a developing solution, and that the complexity is mitigated by disposing the resist coating unit (COT) on the lower tier as described above. It is possible, however, to arrange the resist coating unit (COT) on the upper tier as required.

As shown in FIG. 3, in the third processing unit group $G_3$, oven-type processing units in each of which the wafer W is placed on a mounting table SP to undergo predetermined processing are multi-tiered. In the third processing unit group $G_3$, four hot plate units (HP) 51 which are heat processing units and two cooling units (COL) 52 which are cooling processing units are arranged. In addition to that, an adhesion unit (AD) for performing so-called hydrophobic processing to enhance fixedness of the resist and an extension unit (EXT) for carrying the wafer W in and out are arranged. Those units are stacked in an order of COL-AD-COL-EXT-HPs (four) from the bottom. It is also suitable to give one cooling unit (COL) an alignment function.

Also in the fourth processing unit group $G_4$, oven-type processing units are multi-tiered, and four hot plate units (HP) 51 and three cooling units (COL) 52 are arranged. In addition to that, an extension unit (EXT) for carrying the wafer W in and out is disposed. Those units are stacked in an order of COL-COL-EXT-COL-HPs (four) from the bottom.

The above arrangement of the cooling units (COL) 52 having a low processing temperature at the lower tiers and the heat processing units (HP) 51 having a high processing temperature at the upper tiers can reduce thermal mutual interference between units. Random multi-tiered arrangement is naturally suitable.

Each cooling unit (COL) 52 of the third and fourth processing unit groups $G_3$ and $G_4$ is a cooling unit having normal accuracy which has been conventionally used, in which temperature control with accuracy lower than that of the aforesaid high accuracy cooling unit (HCOL) 50 is performed.

As described above, the fifth processing unit group $G_5$ can be provided on the rear side of the main wafer transfer mechanism 22. In the case where the fifth processing unit group $G_5$ is provided, it can be moved along guide rails 25 laterally as seen from the main wafer transfer mechanism 22. Accordingly, even in the case where the fifth processing unit group $G_5$ is provided, a space portion is obtained by sliding the fifth processing unit group $G_5$ along the guide rails 25, so that maintenance operation for the main wafer transfer mechanism 22 can be easily performed from the back thereof. For the operation, a space can be similarly secured not only by moving the fifth processing unit group $G_5$ linearly, but also by turning it. Incidentally, one processing unit group having basically the same structure as that of the third and fourth processing unit groups $G_3$ and $G_4$ in which oven-type processing units are multi-tiered can be used as the fifth processing unit group $G_5$.

The aforesaid interface section 12 has the same length as the processing station 11 in a depth direction (the X-direction). As shown in FIG. 1 and FIG. 2, a transportable pickup cassette CR and a fixed-type buffer cassette BR are two-tiered at the front of the interface section 12, an edge aligner 23 is disposed at the rear, and a wafer transfer mechanism 24 is disposed at the center. The wafer transfer mechanism 24 has a wafer transfer arm 24a and the wafer transfer arm 24a moves in the θ-direction and the Z-direction to be accessible to both the cassettes CR and BR, and the edge aligner 23. Moreover, the wafer transfer arm 24a is rotatable in the θ-direction to be accessible to the extension unit (EXT) included in the fourth processing unit group $G_4$ of the processing station 11 and also to a wafer delivery table (not shown) on the adjacent aligner side.

Next, the high accuracy cooling unit (HCOL) 50 will be explained with reference to FIG. 5.

As described above, the high accuracy cooling unit (HCOL) 50 can control temperature with accuracy higher than that of the cooling unit (COL) 52 which is the same as the conventional one, and is configured to accurately cool the wafer W to a predetermined temperature in an atmosphere which is managed in temperature with the same high accuracy as that of the resist coating unit (COT) and the developing unit (DEV).

A cooling plate 81 is provided in a processing chamber 80 of the high accuracy cooling unit (HCOL) 50. A raising and lowering mechanism 82 for raising and lowering three lift pins 83 is provided below the cooling plate 81, and these lift pins 83 pass through the cooling pate 81 to raise and lower the wafer W. Moreover, a carrying in/out port 84 for carrying in/out the wafer W mounted on the holding members 48 of the wafer transfer device 46 is provided on a side of the processing chamber 80, and further an exhaust pipe 85 for exhausting air in the processing chamber 80 is provided at the bottom of the processing chamber 80. Furthermore, the cooling plate 81 is provided with a cooling medium passage not shown, and the cooing medium passage is supplied with a cooling medium from a cooling medium supply source 86, whereby the wafer W on the cooling plate 81 is cooled. Further, a temperature control system 87 controls a cooling temperature for the wafer W.

The cooling units (COL) 52 of the third and fourth processing unit groups $G_3$ and $G_4$ also have basically the same structure as that of the high accuracy cooling unit (HCOL) 50, but the accuracy of the temperature control system is different.

In this embodiment, at the time when the wafer W is carried into the resist coating unit (COT) or the developing unit (DEV) either of which is a coating system unit, the aforesaid controller 70 controls the drive mechanisms 61, 62, and 63 of the main wafer transfer mechanism 22 to carry the wafer W from the high accuracy cooling unit (HCOL) 50 directly into the resist coating unit (COT) or the developing unit (DEV) after cooling processing with high accuracy is performed for the wafer W in the high accuracy cooling unit (HCOL) 50 without exception. In other words, the control is performed so that after the heat processing in the hot plate unit (HP) 51 or the like, the wafer W is subjected to rough cooling in the cooling unit (COL) 52 and thereafter to cooling processing with high accuracy in the high accuracy cooling unit (HCOL) 50, and then carried into the resist coating unit (COT) or the developing unit (DEV). Alternatively, it is also possible that after the heat processing in the hot plate unit (HP) 51 or the like, the wafer W, without undergoing the cooling unit (COL) 52, is subjected to cooling processing with high accuracy in the high accuracy cooling unit (HCOL) 50, and then carried into the resist coating unit (COT) or the developing unit (DEV).

Next, processing operations in the resist coating and developing processing system 1 will be explained.

First, the wafer transfer arm 21a of the wafer transfer mechanism 21 gets access to a wafer cassette CR housing unprocessed wafers W on the cassette mounting table 20 and takes one wafer W out of the cassette CR in the cassette station 10, and then transfers the wafer W to the extension unit (EXT) of the third processing unit group $G_3$.

The wafer W is carried into the processing station 11 from the extension unit (EXT) by the wafer transfer device 46 of the main wafer transfer mechanism 22. Then, the wafer W, after being subjected to cooling processing in any of the cooling units (COL) 52 or directly, is carried into the high accuracy cooling unit (HCOL) 50 to be controlled to a predetermined temperature. Thereafter, the wafer W is transferred to one of the resist coating units (COT) and coated with a resist for a reflection protection film (a bottom layer) there. After the coating processing of the reflection protection film resist, heat processing at a low temperature for removing water is performed by any of the hot plate units (HP) 51 and heat processing at a high temperature for curing is performed by the other hot plate unit (HP) 51. It should be noted that hydrophobic processing (HMDS processing) may be performed in the adhesion unit (AD) in place of the performance of such formation of the reflection protection film and heat processing.

After the completion of the coating processing of the reflection protection film and heat processing, the wafer W is transferred to any of the cooling units (COL) 52 by the wafer transfer device 46 to be subjected to cooling processing to some extent, and thereafter carried into the high accuracy cooling unit (HCOL) 50 to be subjected to cooling processing with high accuracy. The wafer W may be directly cooled in the high accuracy cooling unit (HCOL) 50 with a skip of the cooling unit (COL) 52, but there is a danger to exert a thermal influence on the resist coating unit (COT) and the developing unit (DEV), and thus it is preferable to roughly remove heat once in the cooling unit (COL) 52.

In the case where the hydrophobic processing (HMDS processing) is performed in the adhesion unit (AD), since this processing is heat processing accompanied by heating, cooling to some extent is performed in the cooling unit (COL) 52 after the hydrophobic processing, and thereafter cooling processing with high accuracy is performed in the high accuracy cooling unit (HCOL).

The wafer W which has been cooled in the high accuracy cooling unit (HCOL) is subsequently transferred to the resist coating unit (COT) for applying a normal resist by the wafer transfer device 46 and a resist film is formed there. After the completion of the coating processing, the wafer W is subjected to prebake processing in any of the hot plate units (HP) 51 of the processing unit groups $G_3$ and $G_4$, and thereafter cooled in any of the cooling units (COL) 52.

The cooled wafer W is transferred to the interface section 12 via the extension unit (EXT) of the fourth processing unit group $G_4$.

In the interface section 12, edge exposure is performed by the edge aligner 23 to remove an excess resist, and thereafter the wafer W is transferred to the aligner (not shown) provided adjacent to the interface section 12 and exposure processing is performed for the resist film on the wafer W in accordance with a predetermined pattern.

The wafer W after the exposure is returned to the interface section 12 and transferred to the extension unit (EXT) included in the fourth processing unit group $G_4$ by the wafer transfer mechanism 24. The wafer W is transferred to any of the hot plate units (HP) 51 by the wafer transfer device 46 to undergo post-exposure bake processing.

Then, the wafer W is transferred to any of the cooling units (COL) 52 by the wafer transfer device 46 to be subjected to cooling processing to some extent, and thereafter carried into the high accuracy cooling unit (HCOL) 50 and subjected to high accuracy cooling processing.

The wafer W which has been cooled in the high accuracy cooling unit (HCOL) as described above is subsequently transferred to the developing unit (DEV) by the wafer transfer device 46 and coated with a developing solution there, whereby development of an exposed pattern is performed. After the completion of the development, the wafer W is transferred to any of the hot plate units (HP) and subjected to postbake processing, and then cooled by the cooling unit (COL). After the completion of such a series of processes, the wafer W is returned to the cassette station 10 via the extension unit (EXT) of the third processing unit group $G_3$ and housed in any of the wafer cassettes CR.

Figure 6:
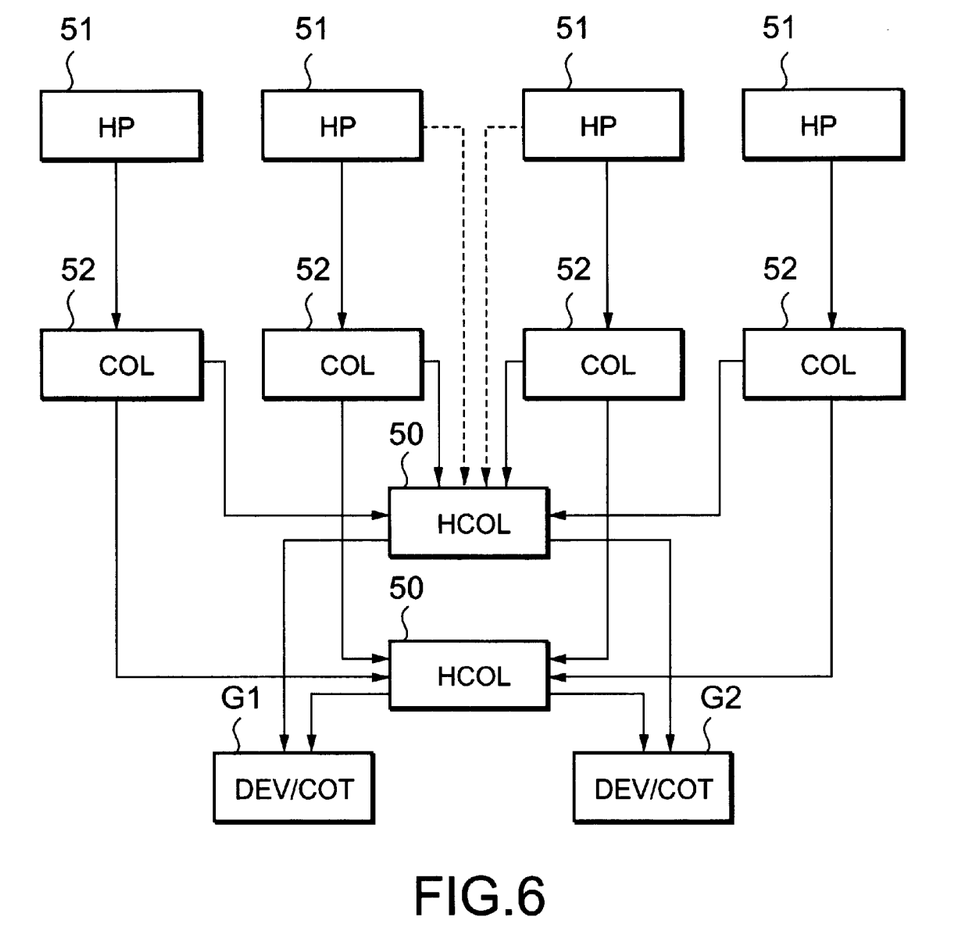
FIG. 6 is a block diagram schematically showing the basic concepts of the present invention.

In this embodiment, as described above, after the heat processing, when cooling processing before the wafer W is carried into the resist coating unit (COT) or the developing unit (DEV) is performed, the wafer W is cooled in the high accuracy cooling unit (HCOL) 50 without exception just before the carrying in. In other words, as schematically shown in FIG. 6, the wafer W which has been subjected to heat processing in any of the hot plate units (HP) 51 is transferred to any of the normal cooling units (COL) 52 by the wafer transfer device 46, then transferred to the high accuracy cooling unit (HCOL) 50 without exception, and thereafter transferred to any of the resist coating units (COT) or the developing units (DEV). Further, in some cases, the wafer W is transferred from the hot plate unit (HP) 51 directly to the high accuracy cooling unit (HCOL) 50, and thereafter transferred to any of the resist coating units (COT) or the developing units (DEV). Incidentally, in FIG. 6, arrows show transfer paths of substrates. Moreover, in FIG. 6, four hot plate units (HP) 51 and cooling units (COL) 52 are shown for convenience.

Figure 5:
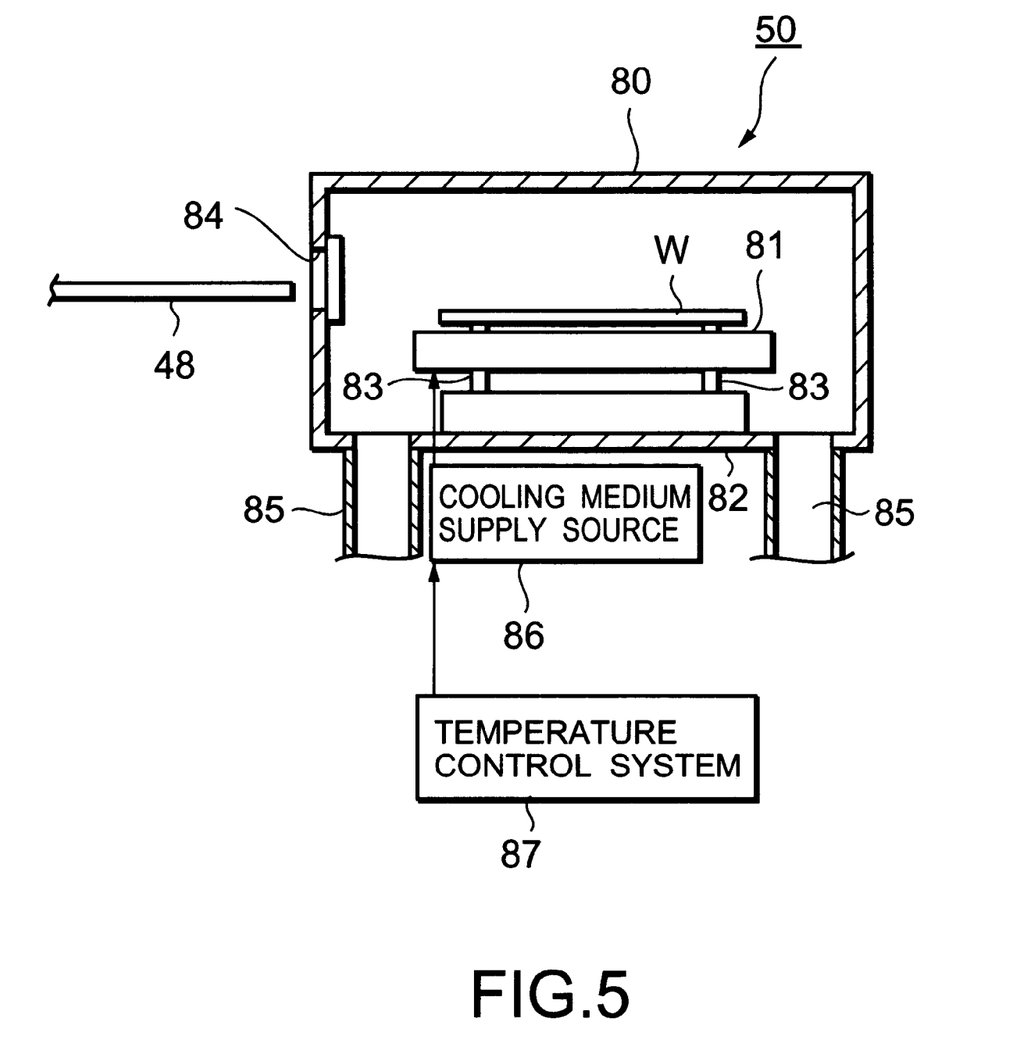
FIG. 5 is a sectional view schematically showing a high accuracy cooling unit.

In this case, the wafer W is carried into the processing chamber 80 through the carrying in/out port 84 by the holding members 48 of the wafer transfer device 46 and mounted on the lift pins 83 in the high accuracy cooling unit (HCOL) 50 as shown in FIG. 5. The lift pins 83 are lowered, whereby the wafer W is brought close to the cooling plate 81 or mounted on the cooling plate 81, so that the wafer W is cooled to a predetermined temperature with high accuracy by the cooling plate 81 which is temperature-controlled with high accuracy by the temperature control system 87. Thereafter, the wafer W is raised by the lift pins 83 to be mounted on the holding members 48 of the wafer transfer device 46 and carried out of the processing chamber 80.

As described above, the rough cooling processing is performed by a plurality of normal cooling units (COL), and thereafter, the high accuracy cooling processing is performed by the high accuracy cooling units (HCOL) 50, so that the cooling processing in the high accuracy cooling unit (HCOL) 50 is performed sufficiently in a short period of time and many substrates can be successively cooled with high accuracy, resulting in improved throughput. More than that, two high accuracy cooling units are sufficient in number, and thus there is little increase in apparatus cost.

Further, since the high accuracy cooling units (HCOL) 50 are disposed in the atmosphere of the resist coating units (COT) and the developing units (DEV), the cooling processing for the wafer W in the high accuracy cooling unit (HCOL) 50 can be performed in the same atmosphere as that of the resist coating unit (COT) and the developing unit (DEV), thereby further improving the accuracy of the cooling temperature.

It should be noted that the present invention is not limited to the above embodiment and can be modified variously. For example, though the case where two high accuracy cooling units (HCOL) 50 are provided is described in the aforesaid embodiment, but not limited to that, it is suitable to provide three or more high accuracy cooling units. It is also suitable to provide the high accuracy cooling units (HCOL) 50 in number in correspondence with, for example, the number of the resist coating units (COT) and the developing units (DEV). However, in the case where many high accuracy cooling units (HCOL) 50 are provided, differences in temperature between units are susceptible to occurring and the adjustment of the different temperatures is complicated, and thus it is preferable that the number of the high accuracy cooling units is smaller. Further, the high accuracy cooling units (HCOL) 50 are arranged in the atmosphere of the resist coating units (COT) and the developing units (DEV) in the aforesaid embodiment, but the arrangement is not limited to that. Furthermore, two or more high accuracy cooling units are necessary in the aforesaid embodiment from the viewpoint of transferring the wafer to both the resist coating units (COT) and the developing units (DEV), but one high accuracy cooling unit may be sufficient in number depending on the apparatus configuration. Moreover, the high accuracy cooling is performed before the substrate is carried into the resist coating unit (COT) and the developing unit (DEV), but the high accuracy cooling may be performed only for any one of the cases. Further, though the case of using a semiconductor wafer as a substrate is described, but not limited to this, the present invention can be applied to processing for another substrate such as a substrate for a liquid crystal display device (LCD) and the like.

Figure 7:
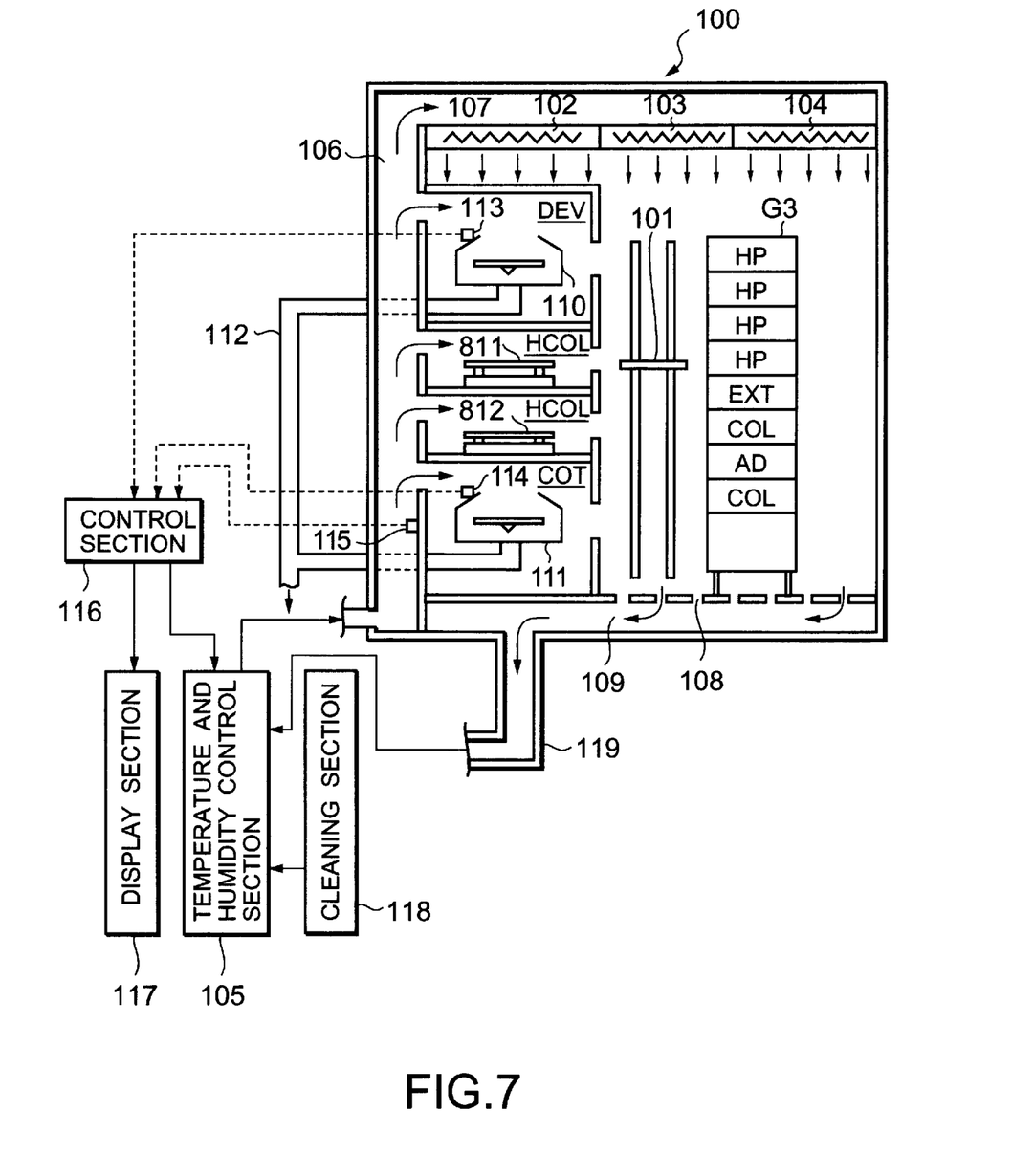
FIG. 7 an elevational view showing the entire structure of a modification of the resist coating and developing processing system according to the aforesaid embodiment.

The high accuracy cooling unit (HCOL) 50 in FIG. 5 in the aforesaid embodiment is configured to cool the wafer W to a predetermined temperature in the same atmosphere which is temperature-controlled with high accuracy as that of the resist coating unit (COT) and the developing unit (DEV). In place of the above configuration, it is also suitable to perform control of not only temperature but also variations in humidity as shown in FIG. 7. In other words, a system 100 may be configured so that a resist coating unit (COT), a developing unit (DEV), high accuracy cooling units (HCOL) which are vertically two-tiered, a wafer transfer device 101, a third processing unit group G₃, filters 102, 103, and 104 of the processing station 11, and the like are installed inside thereof. Part of air which is adjusted in temperature and humidity in a temperature and humidity control section 105 reaches an upper space 107 from a vertical duct 106, passes through the filters 102 to 104, and flows downward inside the system 100. This flow of air is formed to flow into a lower space 109 through air vents 108 to return to the temperature and humidity control section 105. Further, part of the aforesaid adjusted air also flows from the vertical duct 106 into the resist coating unit (COT), the two high accuracy cooling units (HCOL), and the developing unit (DEV). Insides of drain cups 110 and 111 of the developing unit (DEV) and the resist coating unit (COT) communicate with a collective exhaust line on the factory side through an exhaust passage 112. On the drain cups 110 and 111 provided are monitor sensors 113 and 114 for monitoring humidity in the respective units (COT) and (DEV). Moreover, also in the vertical duct 106, a control sensor 115 for detecting the humidity of the air supplied to the developing unit (DEV) and the resist coating unit (COT) is provided. The detected results by the sensors 113, 114, and 115 are output to a control section 116 which is composed of, for example, a microcomputer. The results detected by the monitor sensors 113 and 114 provide a display section 117, while the temperature and humidity control section 105 is controlled based on the result detected by the control sensor 115. It should be noted that a numeral 118 is a cleaning section for cleaning the air that is added in accordance with the amount of air shortage in the system 100 and the air flowing from this cleaning section 118 and a circulation passage 119 is controlled to optimal temperature and humidity in the temperature and humidity control section 105 and passed into the vertical duct 106. Further, numerals 811 and 812 show cooling plates.

According to the modification, also the humidity in the vertical duct 106 is detected to supply the air which is finely adjusted in temperature and humidity to the developing unit (DEV) and the resist coating unit (COT), whereby unniformity in humidity can be suppressed as much as possible not only in the resist coating unit (COT) and the developing unit (DEV) but also in the processing chamber. It should be noted that the position at which the control sensor 115 is provided is not limited to the above, and any position is suitable if it is in the vertical duct 106 before branching out to the resist coating unit (COT) and the developing unit (DEV) as in the aforesaid embodiment. However, it is preferable to dispose the control sensor 115 at a position as close to the processing chambers such as the resist coating unit (COT) and the developing unit (DEV) as possible.

Figure 8:
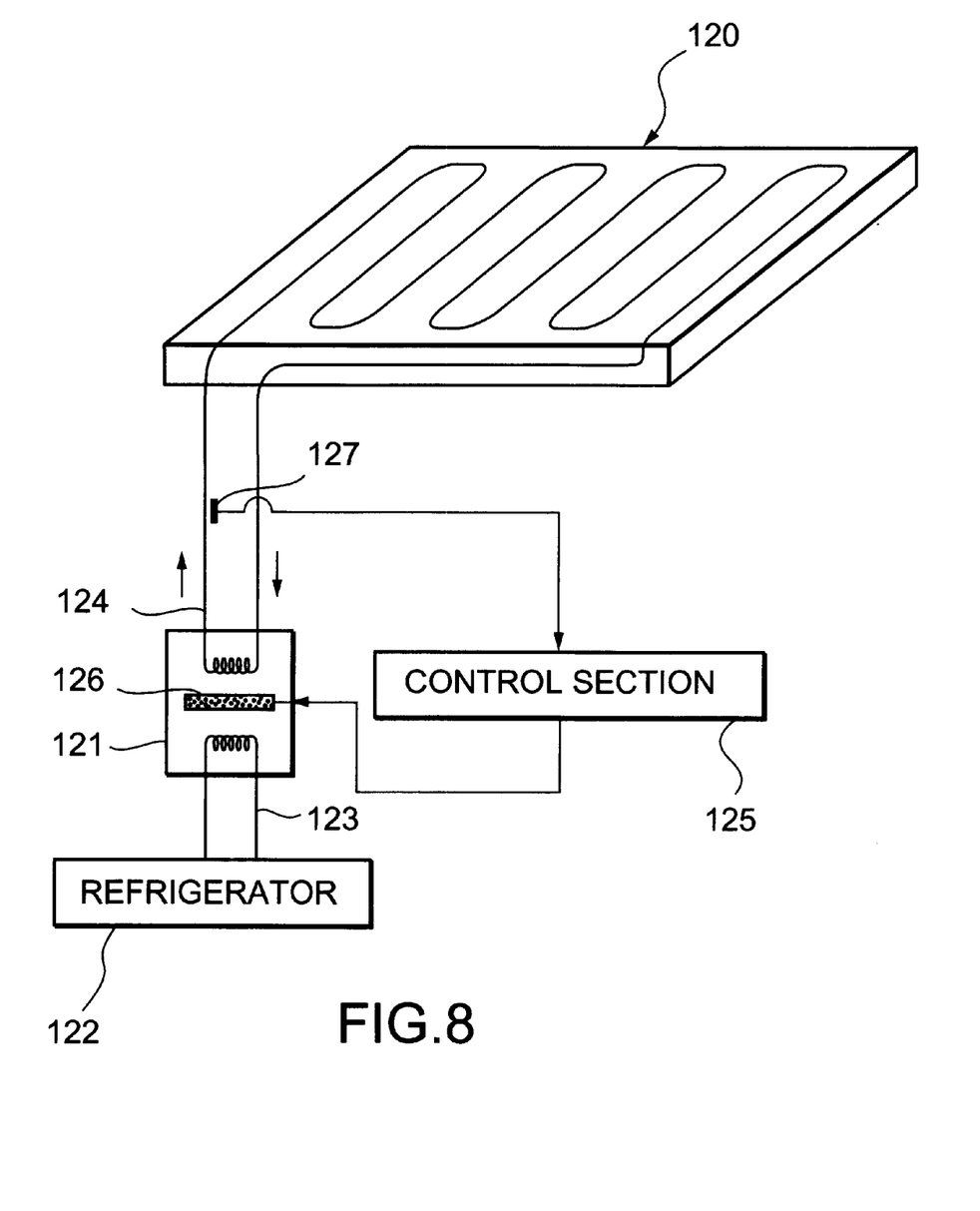
FIG. 8 is an external view showing a modification of a cooling plate of a low accuracy cooling unit (COL) according to the aforesaid embodiment.

Another modification shown in FIG. 8 is configured to allow a tap water which is cooled to a predetermined temperature to flow through a cooling plate 120 of a low accuracy cooling unit (COL). In this configuration, a hot plate 126 which is temperature-controlled to, for example, 23° C. by a control section 125 is positioned between a cooling medium pipe 123 of a refrigerator 122 and a water pipe 124 which are arranged to face a temperature adjustment head 121. A numeral 127 shows a feed back temperature sensor provided on the water pipe 124.

According to this modification, in contrast to a low accuracy cooling unit (COL) using costly Peltier elements, the tap water which has been controlled to an optimal temperature by the control section 125 is controlled to a predetermined temperature via the hot plate 126 to be used, whereby a low accuracy cooling unit (COL) at low cost can be easily fabricated.

Figure 9:
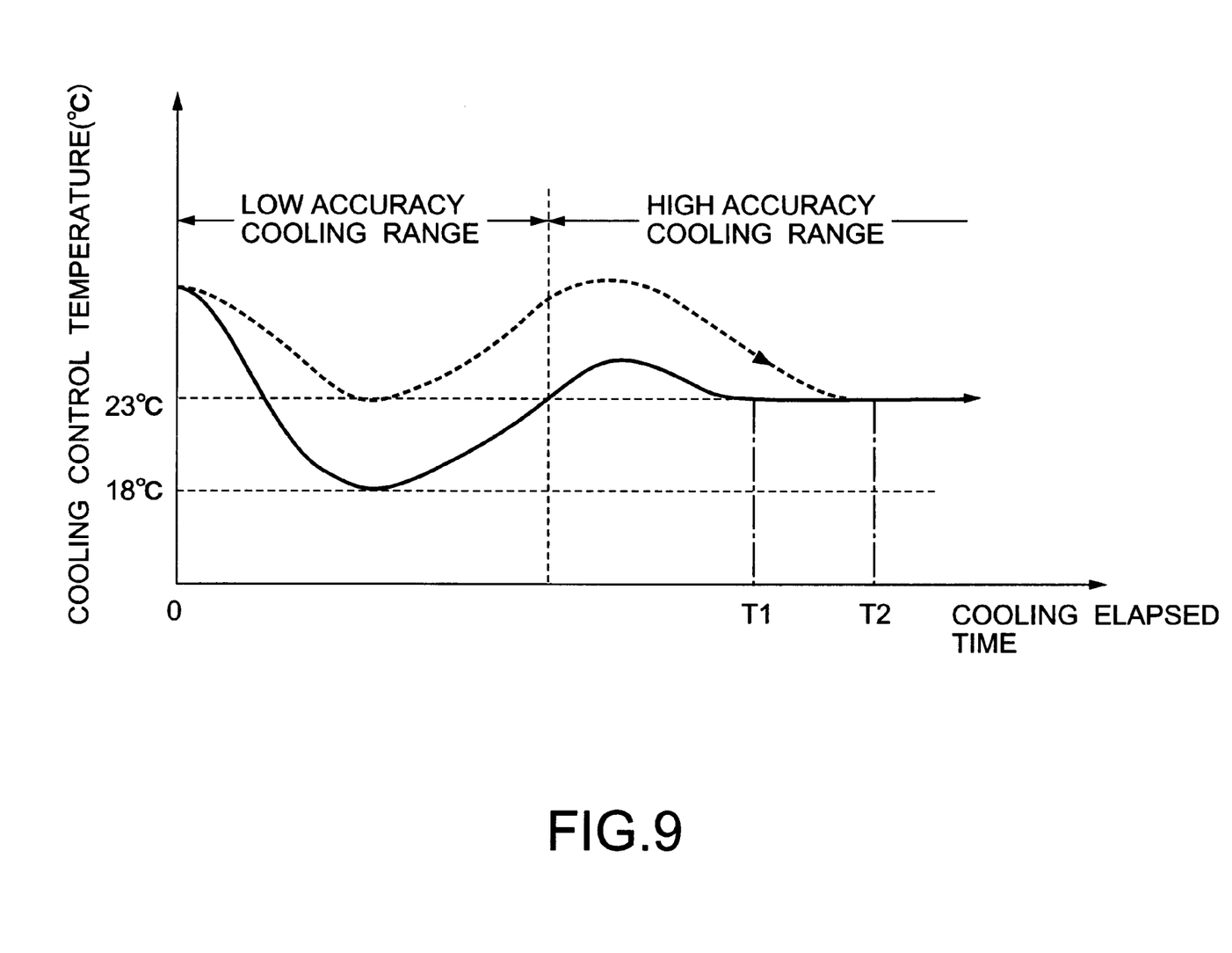
FIG. 9 is a graph showing the relation between a cooling control temperature and a cooling elapsed time in another modification.

Further, another modification shown in FIG. 9 will be explained. In the aforesaid embodiment, before being carried into the resist coating unit (COT) and the developing unit (DEV), the wafer W is first cooled with low accuracy in the cooling unit (COL) 52 and then the cooling plate 81 of the high accuracy cooling unit (HCOL) is cooled with high accuracy. In this case, as a graph showing the relation between a cooling control temperature and a cooling elapsed time in FIG. 9, the lowest cooling temperature of the low accuracy cooling which is performed in the cooling unit (COL) is set at, for example, 18° C. and the lowest cooling temperature of the high accuracy cooling which is performed in the high accuracy cooling unit (HCOL) is set at, for example, 23° C. In other words, this modification is configured to control so that the cooling temperature in a low accuracy cooling range is lower than the cooling temperature in a high accuracy cooling range.

Comparing the cooling elapsed times in the case where control in the low accuracy cooling range is performed at a temperature lower than that in the high accuracy cooling range (a solid line in FIG. 9) and the case where cooling is performed at a high temperature in the low accuracy cooling range (a broken line in FIG. 9), the former case earlier reaches the target cooling temperature of 23° C. and a cooling elapsed time T1 converges to 23° C. with stability earlier than T2 which is a cooling elapsed time of the latter. Therefore, the period of cooling time is reduced by the above extent, so that there is an advantageous effect of reducing the period of time necessary for processes.

In this case, the temperature in the low accuracy cooling in the cooling unit (COL) is controlled to be lower than a desired adjusted temperature of the wafer W, resulting in an effect of further reducing the period of cooling time.

Figure 10A:
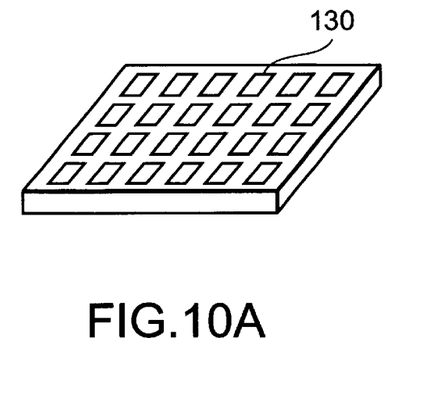
Figure 10B:
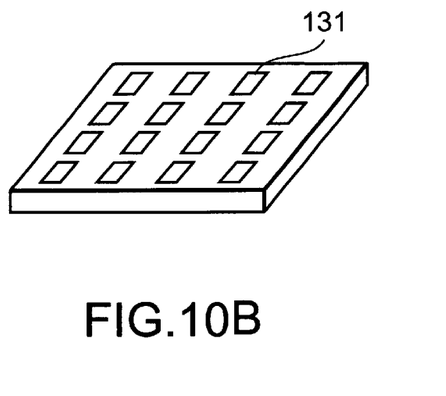

Further, another modification shown in FIG. 10 will be explained. The cooling plates 81 used in the high accuracy cooling units (HCOL) use costly Peltier elements, and thus the more heavily the cooling plates 81 are used, the more disadvantageous in cost. Accordingly, in the case where control is performed so that the cooling accuracy in the high accuracy cooling unit (HCOL) before the wafer W is carried into the resist coating unit (COT) is higher than the cooling accuracy in the high accuracy cooling unit (HCOL) before the wafer W is carried into the developing unit (DEV), the high accuracy cooling units (HCOL) are applied to the use for the resist coating unit (COT), for example, by increasing Peltier elements 130 used as in FIG. 10(a) and to the use for the developing unit (DEV) by decreasing Peltier elements 131 used as in FIG. 10(b), thereby coping with the cooling accuracy with no increase in cost.

Figure 11A:
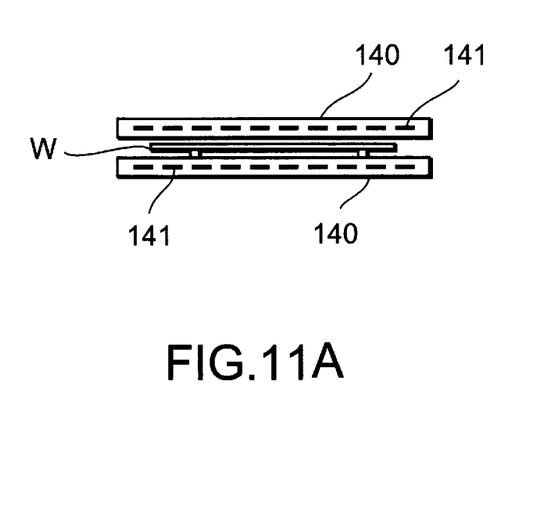
Figure 11B:
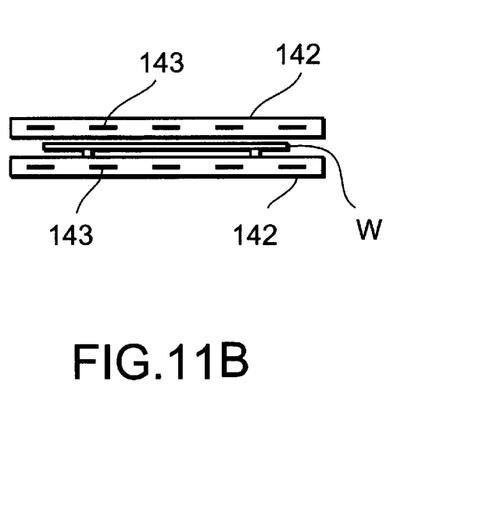

Further, in the case where adjoining cooling plates 140 are used to vertically hold the wafer W therebetween, it is suitable to apply one using a large number of Peltier elements 141 as in FIG. 11(a) to the resist coating unit (COT) and the other using a small number of Peltier elements 143 in cooling plates 142 as in FIG. 11(b) to the developing unit (DEV).

Figure 12:
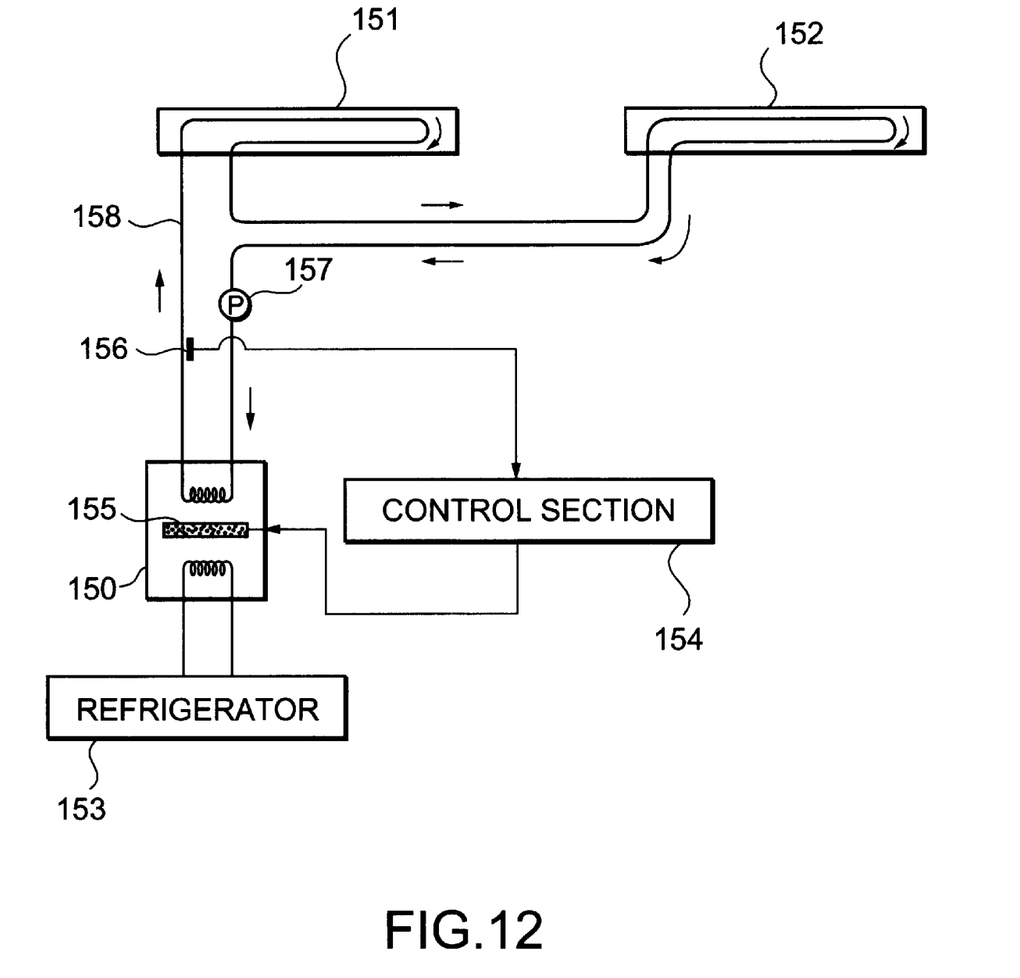
FIG. 12 is a system configuration diagram in high accuracy cooling according to still another modification of the aforesaid embodiment.

Furthermore, a modification shown in FIG. 12, in a water pipe in which water temperature is controlled to, for example, 23° C. at a temperature adjustment head 150, it is suitable to configure so that a cooling plate 151 of the resist coating unit (COT) is first placed and the water flowing out of the resist coating unit (COT) is passed through a cooling plate 152 of the developing unit (DEV). Incidentally, in FIG. 12, a numeral 153 shows a refrigerator, a numeral 154 shows a control section, a numeral 155 shows a hot plate, a numeral 156 shows a feed back water temperature sensor, a numeral 157 shows a water pump, and a numeral 158 shows a water pipe respectively.

According to the above configuration, the cooling medium temperature of, for example, 16° C. receives a heat influence of the hot plate 155 which is higher in temperature than the cooling medium temperature in the temperature adjustment head 150. Therefore, the water flowing through the temperature adjustment head 150 is temperature-controlled to 23° C. and flows into the water pipe 158. The water flowing out of the temperature adjustment head 150 flows through the cooling plate 151 of the resist coating unit (COT) which is provided at the beginning of the downstream from the temperature adjustment head 150 and thereafter flows through the developing unit (DEV). Therefore, the high accuracy cooling before the resist coating unit (COT) can be controlled more accurately than the high accuracy cooling before the developing unit (DEV).

As has been described, according to the present invention, the substrates which have been subjected to heat processing are subjected to cooling processing in a plurality of first cooling processing units which are temperature-controlled with comparatively low accuracy and in second cooling units which are temperature-controlled with comparatively high accuracy. When the substrate is transferred to the coating processing unit, the substrate is cooled at all times in the second cooling unit which is temperature-controlled with high accuracy and then transferred directly to the coating processing unit. Therefore, after rough cooling processing with low accuracy is performed in the plurality of first cooling processing units, the temperature control can be performed in a short period of time with high accuracy in the second cooling processing units, thereby performing high accuracy cooling with no decrease in throughput. Moreover, it is sufficient to partly use such cooling processing units for performing temperature control with high accuracy, and thus an increase in apparatus cost can be suppressed.

The aforesaid embodiments have the intention of cleaning technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus for applying a coating solution to a substrate and performing heat processing and subsequent cooling processing for the substrate, comprising:

a coating processing unit for applying the coating solution to the substrate;

a heat processing unit for performing the heat processing for the substrate;

a plurality of first cooling processing units for performing the cooling processing for the substrate;

a second cooling processing unit, which is temperature-controlled more accurately than the first than the first cooling processing unit, the second cooling processing unit being provided near the coating processing units, for performing the cooling processing for the substrate, said first and second cooling processing units respectively including a plurality of Peltier elements, the number of Peltier elements in each of said first cooling processing units being smaller than the number of Peltier elements in said second cooling processing unit; and a transfer mechanism for transferring the substrate between said units, wherein the substrate which has been subjected to the heat processing by said heat processing unit is subjected to the cooling processing in one of said first cooling processing units or said second cooling precessing unit, and wherein when the substrate is transferred to said coating processing unit, the substrate is cooled in said second cooling processing unit at all times and then directly transferred to said coating processing unit.

2. The apparatus as set forth in claim 1, wherein the substrate which has been subjected to the heat processing by said heat processing unit is subjected to the cooling processing in any of said first cooling processing units and thereafter to the cooling processing in said second cooling processing unit.

3. The apparatus as set forth in claim 1, further comprising:

control means for controlling said transfer mechanism so that when the substrate is transferred to said coating processing unit, the substrate is cooled in said second cooling processing unit at all times and then transferred directly to said coating processing unit.

4. The apparatus as set forth in claim 1, wherein said second cooling processing unit is placed in an atmosphere of said coating processing unit.

5. The apparatus as set forth in claim 1, wherein said coating processing unit is a resist coating unit for applying a resist solution or a developing unit for applying a developing solution on a resist film to perform developing after the resist film on the substrate is exposed in a predetermined pattern.

6. The apparatus as set forth in claim 5, wherein the resist coating unit or the developing unit has a control sensor for detecting a humidity of air supplied to the resist coating unit or the developing unit and a humidity control section for controlling the humidity based on a result detected by the control sensor.

7. The apparatus as set forth in claim 1, wherein said first cooling units are cooled using a cooling water.

8. The apparatus as set forth in claim 1,
wherein a cooling temperature of said first cooling processing units is controlled at a temperature lower than a cooling temperature of said second cooling processing unit.

9. The apparatus as set forth in claim 8,
wherein the cooling temperature of said first cooling processing units is set lower than a substrate adjustment temperature to be controlled.

10. The apparatus as set forth in claim 1,
wherein said first and second cooling processing units are respectively supplied with a cooling water, and
wherein the cooling water which has been supplied to said second cooling processing unit is supplied to said first cooling processing unit as a cooling water.

11. A substrate processing apparatus for applying a coating solution to a substrate and performing heat processing and subsequent cooling processing for the substrate, comprising:
- a coating processing unit for applying the coating solution to a substrate;
- a heat processing unit for performing the heat processing for the substrate;
- a plurality of first cooling processing units for performing the cooling processing for the substrate;
- a second cooling processing unit, which is temperature-controlled more accurately than the first cooling processing units, the second cooling processing unit being provided near the coating processing unit for performing the cooling processing for the substrate, said first and second cooling processing units being respectively supplied with a cooling water, and the cooling water which has been supplied to said second cooling processing unit being supplied to said first cooling processing units as a cooling water; and
- a transfer mechanism for transferring the substrate between said units,
  wherein the substrate which has been subjected to the heat processing by said heat processing unit is subjected to the cooling processing in one of said first cooling processing units or said second cooling processing unit, and
  wherein when the substrate is transferred to said coating processing unit, the substrate is cooled in said second cooling processing unit at all times and then directly transferred to said coating unit.

12. The apparatus as set forth in claim 11, wherein the substrate which has been subjected to the heat processing by said heat processing unit is subjected to the cooling processing in any of said first cooling processing units and thereafter to the cooling processing in said second cooling processing unit.

13. The apparatus as set forth in claim 11, further comprising control means for controlling said transfer mechanism so that when the substrate is transferred to said coating processing unit, the substrate is cooled in said second cooling processing unit at all times and then transferred directly to said coating processing unit.

14. The apparatus as set forth in claim 11, wherein said second cooling processing unit is placed in an atmosphere of said coating processing unit.

15. The apparatus as set forth in claim 11, wherein said coating processing unit is a resist coating unit for applying a resist solution or a or a developing unit for applying a developing solution on a resist film to perform developing after the resist film on the substrate is exposed in a predetermined pattern.

16. The apparatus as set forth in claim 15, wherein the resist coating unit or the developing unit has a control sensor for detecting a humidity of air supplied to the resist coating unit or the developing unit and a humidity control section for controlling the humidity based on a result detected by the control sensor.

17. The apparatus as set forth in claim 11, wherein a cooling temperature of said first cooling processing units is controlled at a temperature lower than a cooling temperature of said second cooling processing unit.

18. The apparatus as set forth in claim 17, wherein the cooling temperature of said first cooling processing units is set lower than a substrate adjustment temperature to be controlled.

* * * * *